US009520368B1

(12) United States Patent
Tonomura et al.

(10) Patent No.: US 9,520,368 B1
(45) Date of Patent: Dec. 13, 2016

(54) INTEGRATED CIRCUIT SYSTEM HAVING STRIPLINE STRUCTURE

(71) Applicant: Raytheon Company, Waltham, MA (US)

(72) Inventors: Samuel D. Tonomura, Rancho Palos Verdes, CA (US); Anthony M. Petrucelli, Rancho Palos Verdes, CA (US); Cynthia Y. Hang, Rolling Hills Estates, CA (US); Chad Patterson, Marina Del Ray, CA (US); Ethan S. Heinrich, Westborough, MA (US); Michael M. Fitzgibbon, Playa Del Rey, CA (US); John G. Heston, Murphy, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 14/980,602

(22) Filed: Dec. 28, 2015

(51) Int. Cl.
| | |
|---|---|
| *H01L 23/66* | (2006.01) |
| *H01L 23/00* | (2006.01) |
| *H01L 23/528* | (2006.01) |
| *H01L 23/522* | (2006.01) |
| *H01L 23/498* | (2006.01) |

(52) U.S. Cl.
CPC ......... *H01L 23/66* (2013.01); *H01L 23/49822* (2013.01); *H01L 23/49827* (2013.01); *H01L 23/49838* (2013.01); *H01L 23/528* (2013.01); *H01L 23/5226* (2013.01); *H01L 24/17* (2013.01); *H01L 2223/6627* (2013.01); *H01L 2223/6672* (2013.01); *H01L 2223/6683* (2013.01); *H01L 2224/16225* (2013.01); *H01L 2924/1423* (2013.01); *H01L 2924/3011* (2013.01)

(58) Field of Classification Search
CPC .... H01L 23/13; H01L 23/66; H01L 23/49838; H01L 24/17
See application file for complete search history.

(56) References Cited

U.S. PATENT DOCUMENTS

| | | |
|---|---|---|
| 2012/0063097 A1 | 3/2012 | Reza et al. |
| 2012/0068793 A1 | 3/2012 | Chen et al. |
| 2013/0208434 A1 | 8/2013 | Alm |
| 2013/0277843 A1 | 10/2013 | Robbins et al. |

*Primary Examiner* — Thanh V Pham
(74) *Attorney, Agent, or Firm* — Daly, Crowley, Mofford & Durkee, LLP

(57) ABSTRACT

An integrated circuit system having: (A) a semiconductor chip with a signal strip conductor disposed on an upper surface of the chip; an active semiconductor device disposed of the upper surface of the chip electrically connected to the signal strip conductor; and a first ground plane conductor disposed on a bottom surface of the chip disposed under the signal strip conductor; and (B) a support structure having: a second ground plane disposed over, and separated from, the signal strip conductor by a dielectric region between the second ground plane and the signal strip conductor on the chip; a signal contact disposed on the bottom surface of the support structure displaced, electrically insulated, from the second ground plane conductor, and electrically connected to a portion of the signal strip conductor. The signal strip conductor, the first ground plane conductor, and the second ground plane conductor provide a stripline microwave transmission line.

14 Claims, 3 Drawing Sheets

INTEGRATED CIRCUIT SYSTEM HAVING STRIPLINE STRUCTURE

TECHNICAL FIELD

This disclosure relates generally to integrated circuit system and more particularly to flip chip mounted monolithic microwave integrated circuits (MMICs) systems.

BACKGROUND

As is known in the art, flip chip mounted monolithic microwave integrated circuits (MMICs) offer many cost and performance advantages over the traditional mounting approach. Typically flip chip MMICs with bump interconnects are placed face down onto its host substrate or printed circuit board. MMIC thermal dissipation is often channeled through the back of the chip using many forms of thermal interfaces. Performance degradation could result from at the chip-to-substrate interface and the chip-to-thermal interface because of electromagnetic coupling to such interface. Also, flip chip mounted MMICs employing coplanar waveguide (CPW) transmission media could suffer performance degradation due to unintended electromagnetic propagation (e.g. oscillations, gain peaking in frequency response, etc.) when the backside of the chip-substrate interface comes into direct contact with a change in boundary condition, such as any metal (heat spreader, RF probe chuck) or dielectric media (Thermal Interface Materials). Likewise, flip chip mounted MMICs employing CPW transmission media could suffer performance degradation due to unintended coupling to the host substrate compounded with the use of underfill materials required between the chip and the substrate for bump interconnect structural integrity. Finally, matching networks comprised of CPW transmission line elements (edge coupled structures) tend to have higher insertion loss than those of traditional microstrip based approaches, leading to degradation in circuit performance such as noise figure or power added efficiency due to lossy structures.

After first recognizing that the problem does exist, coplanar waveguide-based MMICs have been placed on non-conductive spacers when being RF tested at wafer probe, complicating the test process. In some configurations, coplanar waveguide-based MMICs have been placed on non-conductive heat sinks to minimize the effects caused by undesired electromagnetic modes. However, non-conductive heat sinks are more expensive and offer poor thermal performance relative to metal heat sinks. Also, non-conductive heat sinks minimize the effects of undesired mode propagation but do not completely eliminate them since there still exits a change boundary condition of differing dielectrics at the interface of the chip backside and non-conductive heat sink. Substrate interactions between CPW-based flip chips and the host substrate can be managed with the use of taller bump interconnect (which is limited by bump interconnect processing technology and drives down yields) and/or the use of tighter CPW (defined by ground-signal-ground separation) geometries leading to lossy matching network which penalizes RF performance.

SUMMARY

In accordance with the present disclosure, an integrated circuit system is provided having: (A) a semiconductor chip with a signal strip conductor disposed on an upper surface of the chip; an active semiconductor device disposed of the upper surface of the chip electrically connected to the signal strip conductor; and a first ground plane conductor disposed on a bottom surface of the chip and being disposed under the signal strip conductor, and (B) a support structure having: a second ground plane disposed on a bottom surface, and separated from, the signal strip conductor by a dielectric region between the second ground plane and the signal strip conductor on the chip; and a signal contact disposed on the bottom surface of the support structure displaced, and electrically insulated from, the second ground plane conductor, and electrically connected to a portion of the signal strip conductor. The signal strip conductor, the first ground plane conductor, and the second ground plane conductor provide a stripline microwave transmission line.

In one embodiment, an integrated circuit system is provided having a support structure and a semiconductor chip. The support structure has a ground plane conductor on one portion of a surface and signal contacts on different, dielectrically separated, portions of the surface. The semiconductor chip has on a surface a ground plane conductor and, on an opposite surface, a plurality of active and passive devices, interconnecting signal strip conductors electrically interconnecting the active and passive devices, and electrically conducive signal bump interconnect connected to the signal strip conductors. The electrically conducive signal bump interconnects project outwardly from the surface of the chip and are electrically connected to the signal contacts on the support structure. A dielectric region is formed by the projecting electrically conductive bump interconnects between the ground plane on the support structure and the interconnecting signal strip conductors. The ground plane on the support structure, the dielectric region, the interconnecting strip conductors, and the ground plane conductor of the opposite surface of the chip provide stripline microwave transmission lines for passing microwave signals among the active and passive devices.

In one embodiment, the chip has electrically conductive ground bump interconnects projecting outwardly from the surface of the chip and electrically connected to the second ground plane on the support structure.

In one embodiment, the chip has electrically conductive vias passing between the ground bump interconnects and the first ground plane conductor.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
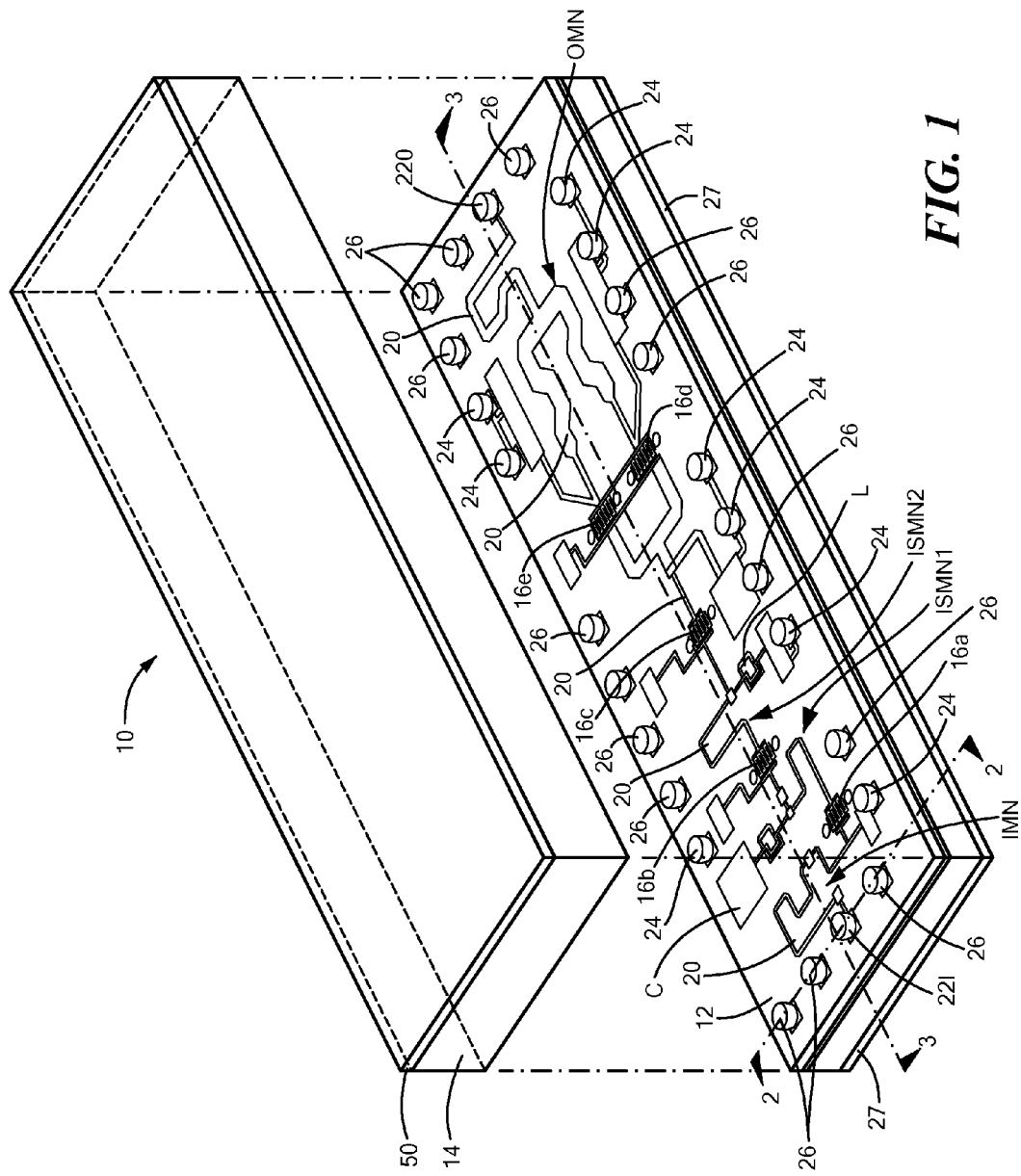
FIG. 1 is an exploded, isometric sketch of an integrated circuit system according to the disclosure.
Figure 2:
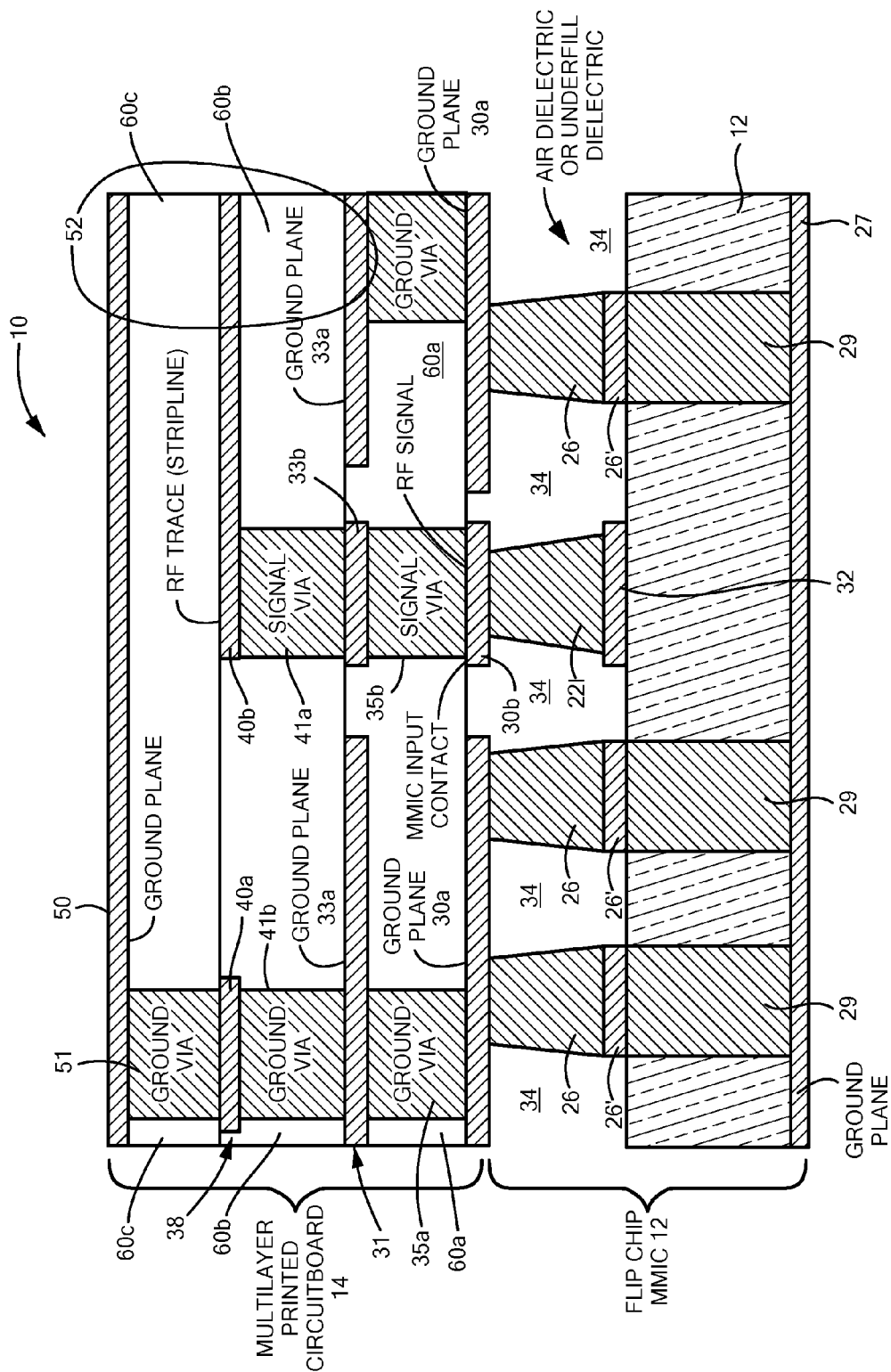
FIG. 2 is an assembled, cross sectional view of a portion of the integrated circuit system of FIG. 1, such cross section being taken along line 2-2 in FIG. 1.
Figure 3:
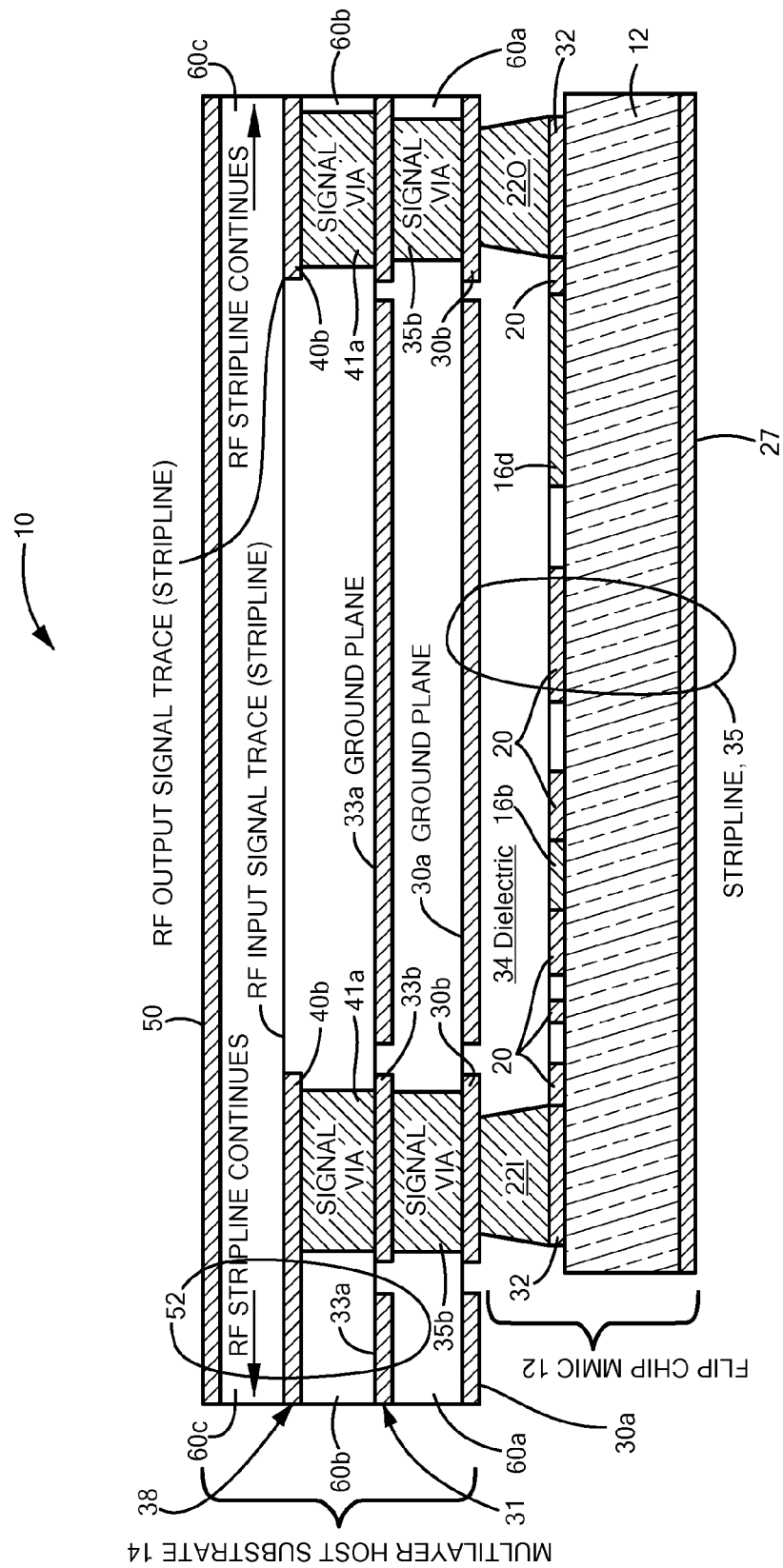
FIG. 3 is an assembled, cross sectional view of a portion of the integrated circuit system of FIG. 1, such cross section being taken along line 3-3 in FIG. 1.

Referring now to FIGS. 1, 2 and 3 an integrated circuit system 10 is shown, having: (A) a monolithic microwave integrated circuit (MMIC) semiconductor chip 12; and (B) a support structure, such as a dielectric support structure, here for example, a high frequency multi-layer printed circuit board 14. The MMIC chip 12, is here for example, Gallium Arsenide (GaAs) having a thickness of here, for example, 4 mils. The chip 12 has active semiconductor regions in an upper surface for active devices, here Field Effect Transistor devices (FETs) 16a-16e. The upper surface of the chip 12 also has formed thereon passive devices, such as inductors L and capacitors, C, and strip conductors 20 electrically interconnected to the active and passive devices 16, L and C on insulating portions of the upper surface of the chip 12, as indicated in this example.

Also disposed on outer peripheral portions of the upper surface of the chip 12 are RF vertically extending signal bump interconnects 22I and 22O and vertically extending DC bias and power bump interconnects 24. One of the RF signal bump interconnects, here an input RF signal bump interconnect 22I, is connected to a portion of the strip conductors 20 arranged to provide an input matching network (IMN) to a first FETs 16a; here arranged to provide a first stage of amplification to an RF signal fed to the input RF signal bump interconnect 22I. The output of the FET 16a is fed to a second FET 16b through another portion of the strip conductors 20 arranged to provide a first intermediate stage matching network (ISMN1) for the FET 16b, here arranged to provide a second stage of amplification to the RF signal. The output of the FET 16b is fed to a third FET 16c through another quantity of the strip conductors 20 arranged to provide a second intermediate stage matching network (ISMN2) for the FET 16c, here arranged to provide a third stage of amplification to the RF signal. The output of the FET 16c is connected to another portion of the strip conductors 20 arranged to provide a power combiner and matching network for a pair of power FETs 16d, 16e, as indicated. The outputs of the FETs 16d, 16e are connected to other portions of the strip conductors 20 to form a power combiner and output matching network (OMN), as shown. The output of the OMN is connected to still another portion of the strip conductors 20 to another one of the RF signal bump interconnects, here an output RF signal bump interconnect 22O, as shown. The IMN, ISMN1, ISMN2, and OMN are also connected to the DC bias and power bump interconnects 24, as indicated.

The chip 12 (FIG. 1) has also formed on the outer peripheral portions of the upper surface, a plurality of vertically extending ground bump interconnects 26. The ground bump interconnects 26 are electrically insulated from the RF signal bump interconnects 22, and DC bias and power bump interconnects 24 by the insulating portions of the chip 12. The chip 12 has formed on the bottom surface a ground plane conductor 27, the ground plane conductor 27 being disposed under the strip conductors 20, as indicated more clearly in FIG. 3. The plurality of ground bump interconnects 26 (FIG. 2) are electrically connected to the ground plane 27 by electrically conductive vias 29 (FIG. 2) passing vertically through the chip 12 between the ground bump interconnects 26 and underlying portions of the ground plane conductor 27 (FIGS. 1 and 2). It should be understood that there may be conductive vias (not shown) within the chip 12 itself, as for example, connecting source electrodes (not shown) of the FETs 16b, 16c (FIG. 3) to the ground plane 27 when configured in a common source configuration.

The high frequency multi-layer printed circuit board 14 (FIGS. 1 and 2), where each conductor layer separated by a layer of dielectric layer, as shown more clearly in FIGS. 2 and 3. The high frequency multi-layer printed circuit board 14 has on one portion of the bottom surface thereof an electrically conductive layer, one portion 30a (FIG. 2) of the electrically conductive layer forming a ground plane conductor electrically connected to the plurality of ground plane bump interconnects 26 and ground plane pads 26' on the chip 12, as shown in FIG. 2, and, on anther portion 30b of the electrically conductive layer, electrically isolated from the ground plane conductor 30a, is electrically connected to the signal pads 32, as indicated in FIGS. 2 and 3 and therefore to upper surfaces of corresponding ones of the electrically conducting signal bump interconnects, 20I and 20O, as shown in FIGS. 2 and 3. It is noted that when the chip 12 is bonded to high frequency multi-layer printed circuit board, a dielectric region 34 (FIGS. 2 and 3) is formed vertically between the upper surface of the chip 12 and the bottom surface of the high frequency multi-layer printed circuit board 14 and in lateral regions between the signal bumps 22I, 22O, the ground bump interconnects 26, and the DC and power bump interconnects 24. The dielectric region 34 may be filled with air or a dielectric filler material. Referring to FIG. 3, it is noted that the portion 30a of the conductive layer on the bottom surface of the high frequency multi-layer printed circuit board 14; the underlying dielectric region 34; the strip conductors 20 on the upper surface of the chip 12; the portion of the chip 12 under the strip conductors 20 and the ground plane conductor 27 form a stripline microwave transmission line 35. It is noted that the dielectric material in region 34 above the strip conductors 20 is different from the dielectric material below the strip conductors 30; hence the structure may be considered as a quasi-stripline microwave transmission line.

A first conductive metal level 31 of the high frequency multi-layer printed circuit board 14 is separated from the conductive layers 30a, 30b by a dielectric layer 60a of the printed circuit portion 14 and such dielectric layer 60a has disposed thereon a conductive layer having ground plane portions 33a, and electrically isolated signal pad portions 33b. The ground plane portions 33a are electrically connected to the ground plane portions 30a through electrically conductive vias 35a (FIG. 2) and the signal pad portions 33b are electrically connected to the signal pads 30b through electrically conductive vias 35b (FIG. 2). It is noted that the ground plane portion 33a is disposed over the ground plane conductor portion 30a.

A second level 38 of the high frequency multi-layer printed circuit board 14 above the first level 31 is separated from the first conductive metal level 31 by a dielectric layer 60b of the printed circuit portion 14 and such dielectric layer 60b having disposed thereon signal strip conductors 40a, 40b electrically connected to electrically conductive portions 33b with vias 41a (FIGS. 2 and 3) as indicated. It is noted therefore, that the electrically conductive portions 40b are electrically connected to the RF signal bumps 22I and 22O through conductive vias 41a, signal pads 33b, vias 35b, and signal pads 30b and are connected to the DC and power bump interconnect 26 (FIG. 1). As noted above, the ground plane conductor 50 is disposed on the top surface of the high frequency multi-layer printed circuit board 14 (FIGS. 2 and 3) and is separated from the second conductive metal level 38 by a dielectric layer 60c (FIG. 3). It is noted that the ground plane conductor 50 is connected to the conductive portion 40a by an electrically conductive via 51 and the conductive portion 40a is connected to the ground plane portion 33a by an electrically ground conductive via 41b. Thus, the ground plane conductor 50 is electrically connected to the ground plane conductor 27 on the bottom surface of the chip 12 (FIG. 2). Thus, referring to FIG. 2, it is noted that the conductive portions 33a, the conductive signal portions 40b, the ground plane conductor 50 and the portions of the high frequency multi-layer printed circuit board 14 between them form a stripline transmission line 52 in the printed circuit board (FIGS. 2 and 3).

In using this quasi-stripline approach for stripline 35, vias in the MMIC substrate 12 and bump interconnects in a dielectric underfill media in region 34 between the MMIC and substrate/heat sink spreader interposer are used to suppress undesired Electromagnetic (EM) propagation. At the same time, substrate/interposer effects (i.e. ground plane) are now an integral part of the design and naturally taken care of. The result is a low cost flip chip MMIC-on substrate system with greatly improved performance over traditional implementations. Thus, when combined with a metalized backside heat spreader mounted to the bottom of ground plane 27 on the chip 12, through various conventional carrier attach processes including wafer-to-wafer bonding techniques not shown, a low cost flip chip MMIC system is created with improved RF performance (e.g. gain and power added efficiency) due the use of low loss stripline passive circuits. In using thinned, 4 mil MMIC substrates, this approach also provides a thermal performance benefits over traditional CPW-based flip chip approaches. The disclosed system can be employed in all MMIC semiconductor process technologies (e.g. GaN, GaAs, Silicon, SiGe) and compatible for all bump interconnect process technology used to realize flip chip MMICs. Likewise, the disclosed system can be employed in all high frequency multi-layer circuit board process technology systems of dielectric (e.g. ceramic/Polytetrafluoroethylene (PTFE) composite systems, polyphenylene ether (PPE) blend resin systems, hydrocarbon/ceramic laminate systems, etc.)

A number of embodiments of the disclosure have been described. Nevertheless, it will be understood that various modifications may be made without departing from the spirit and scope of the disclosure. For example, prior to placing the flip chip MMIC on to the multi-layer circuit board, the use of chip-scale interposer fabricated out of Silicon (Si) could be place between the flip chip MMIC and circuit board. In this instantiation, the silicon interposer would contain the prerequisite through-vias for power and ground connections. The Si-based interposer would also contain the conductive layer forming a ground plane conductor electrically connected to the plurality of ground plane bump interconnects 26 and ground plane pads 26' on the chip 12 shown earlier. Accordingly, other embodiments are within the scope of the following claims.

What is claimed is:

1. An integrated circuit system comprising:
    a semiconductor chip, comprising:
        a signal strip conductor disposed on an upper surface of the chip;
        an active semiconductor device disposed of the upper surface of the chip electrically connected to the signal strip conductor; and
        a first ground plane conductor disposed on a bottom surface of the chip and being disposed under the signal strip conductor; and
    a support structure, comprising:
        a second ground plane conductor disposed on a bottom surface, and separated from, the signal strip conductor by a dielectric region between the second ground plane conductor and the signal strip conductor on the chip; and
        a signal contact disposed on the bottom surface of the a support structure displaced, and electrically insulated from, the second ground plane conductor, and electrically connected to a portion of the signal strip conductor; and
    wherein the signal strip conductor, the first ground plane conductor, and the second ground plane conductor provide a stripline microwave transmission line.

2. An integrated circuit system, comprising:
    a support structure, comprising:
        a ground plane conductor on one portion of a surface of the support structure and signal contacts on different, dielectrically separated, portions of the surface;
    a semiconductor chip, comprising:
        a ground plane conductor disposed on a surface of the chip;
        a plurality of active and passive devices, interconnecting signal strip conductors electrically interconnecting the active and passive devices, and electrically conducive signal bump interconnects connected to the signal strip conductors disposed on an opposite surface of the chip, the electrically conducive signal bump interconnects project outwardly from the surface of the chip and being electrically connected to the signal contacts on the support structure;
    wherein a dielectric region is formed by the projecting electrically conductive bump interconnects between the ground plane on the support structure and the interconnecting signal strip conductors; and
    wherein the ground plane on the support structure, the dielectric region, the interconnecting strip conductors, and the ground plane conductor of the opposite surface of the chip provide stripline microwave transmission lines for passing microwave signals among the active and passive devices.

3. The integrated circuit system recited in claim 2 wherein the chip has electrically conductive ground bump interconnects projecting outwardly from the surface of the chip and electrically connected to the second ground plane on the support structure.

4. The integrated circuit system recited in claim 3 wherein the chip has electrically conductive vias passing between the ground bump interconnects and the first ground plane conductor.

5. An integrated circuit system, comprising:
    (A) a monolithic integrated circuit semiconductor chip, comprising:
        a first signal strip conductor disposed on an upper surface of the chip;
        an active semiconductor disposed of the upper surface of the chip electrically connected to the first signal strip conductor;
        a first ground plane conductor on a bottom surface of the chip, the ground plane conductor being disposed under the first signal strip conductor
        an ground plane interconnect pad disposed on the upper surface of the chip over the first ground plane conductor, displaced and electrically insulated from, the first signal strip conductor;
        an electrically conductive via passing through the chip electrically interconnecting the first ground plane conductor to a bottom surface of the ground plane interconnect pad;
        a plurality of electrically interconnecting bump interconnects, a first one of the plurality of electrically interconnecting bump interconnects having a bottom surface disposed on, and electrically connected to, the signal strip conductor and a second one of the plurality of electrically interconnecting bump interconnects having a bottom surface disposed on, and electrically connected to, an upper surface of the ground plane interconnect pad, the plurality of electrically interconnecting bump interconnects extending above the upper surface of the chip; and (B) a support structure, comprising:
- a second ground plane conductor disposed on a bottom surface of the support structure and electrically connected to an upper surface of the second one of the plurality of electrically interconnecting bump interconnects;
- a second signal strip conductor having a portion disposed over a portion of the second ground plane conductor;
- a signal contact disposed on the bottom surface of the support structure displaced and electrically insulated from the second ground plane conductor;
- a signal conductive via extending into the support structure electrically interconnecting the signal contact to the second signal conductor; and
- a third ground plane;

(C) wherein the signal contact is disposed on, and electrically connected to, an upper surface of the first one of the plurality of electrically interconnecting bump interconnects;

(D) wherein the signal strip conductor, the first ground plane conductor, the second ground plane conductor, and the chip and a bottom portion of the support structure provide a stripline microwave transmission line; and (E) wherein the portion of the second signal conductor and the portion of the second ground plane conductor, the third ground plane, and a portion of the support structure disposed between the third ground plane, the second signal conductor, and the portion of the second ground plane conductor provide a strip transmission line.

6. The integrated circuit recited in claim 1 wherein the support structure comprises a printed circuit board.

7. The integrated circuit recited in claim 2 wherein the support structure comprises a printed circuit board.

8. The integrated circuit recited in claim 5 wherein the support structure comprises a printed circuit board.

9. The integrated circuit recited in claim 1 wherein a dielectric region above the strip conductor is a material different from a dielectric material below the strip conductor.

10. The integrated circuit recited in claim 2 wherein a dielectric region above the strip conductor is a material different from a dielectric material below the strip conductor.

11. The integrated circuit recited in claim 5 wherein a dielectric region above the strip conductor is a material different from a dielectric material below the strip conductor.

12. The integrated circuit recited in claim 9 wherein the support structure comprises a printed circuit board.

13. The integrated circuit recited in claim 10 wherein the support structure comprises a printed circuit board.

14. The integrated circuit recited in claim 11 wherein the support structure comprises a printed circuit board.

* * * * *